United States Patent [19]

Nguyen et al.

[11] Patent Number: 5,764,083
[45] Date of Patent: Jun. 9, 1998

[54] PIPELINED CLOCK DISTRIBUTION FOR SELF RESETTING CMOS CIRCUITS

[75] Inventors: Bang T. Nguyen; Mark Daniel Papermaster, both of Austin, Tex.; Giao Ngoc Pham, Portland, Oreg.; Trang Khanh Ta, Austin; Willem Bernard van der Hoeven, Round Rock, both of Tex.

[73] Assignee: International Business Machines Corporation, Armonk, N.Y.

[21] Appl. No.: 664,966

[22] Filed: Jun. 10, 1996

[51] Int. Cl.[6] .................................................. H03K 19/00
[52] U.S. Cl. ........................................ 326/93; 326/17
[58] Field of Search ............................. 326/17, 21, 93, 326/94, 98

[56] References Cited

U.S. PATENT DOCUMENTS

| | | | |
|---|---|---|---|
| 3,829,790 | 8/1974 | Macrander | 331/61 |
| 4,414,637 | 11/1983 | Stanley | 364/569 |
| 4,862,096 | 8/1989 | Spence | 328/75 |
| 5,173,618 | 12/1992 | Eisenstadt | 307/269 |
| 5,208,776 | 5/1993 | Nasu et al. | 365/200 |
| 5,216,301 | 6/1993 | Gleeson, III et al. | 307/595 |
| 5,258,660 | 11/1993 | Nelson et al. | |
| 5,389,831 | 2/1995 | Eisenstadt | 327/161 |
| 5,517,136 | 5/1996 | Harris et al. | 326/17 X |
| 5,532,625 | 7/1996 | Rajivan | 326/98 |
| 5,614,845 | 3/1997 | Masleid | 326/93 |
| 5,638,008 | 6/1997 | Rangasayee et al. | 326/93 X |

*Primary Examiner*—Stephone Allen
*Assistant Examiner*—Richard Roseen
*Attorney, Agent, or Firm*—Jenkens & Gilchrist; George E. Clark; Anthony V. S. England

[57] ABSTRACT

A system for clocking self resetting CMOS (SRCMOS) circuits operating at high speed includes a clock generator circuit which produces a first pipeline clock pulse of relatively narrow width from a leading edge of a system clock having a relatively long duration with respect to the first pipeline clock, a number of delay circuits, the time duration of each of the delay circuits being determined by characteristics of evaluation logic in the SRCMOS circuits being clocked, the delay circuits being connected in a serial pipeline fashion such that each subsequent delayed clock pulse overlaps a preceding clock pulse by at least a predetermined minimum time duration. The clocking system also includes a cycle relax mode whereby the clock pulse output of the clock generator circuit may be extended for test or diagnostic purposes.

12 Claims, 5 Drawing Sheets

PIPELINED CLOCK DISTRIBUTION FOR SELF RESETTING CMOS CIRCUITS

BACKGROUND OF THE INVENTION

1. Field of the Invention

The present invention relates to electronic circuits, and more particularly to apparatus and method for clocking self resetting CMOS (SRCMOS) circuits operating at high speed.

2. Prior Art

In the prior art there are many techniques for generating clock signals for various circuit technologies.

Examples of prior art patents which describe clock distribution systems are discussed below.

U.S. Pat. No. 3,829,790 teaches a clock distribution system where a pair of distribution paths each have a series of delayed clock pulses, each pulse in a first distribution path having a first fixed pulse duration and each pulse in the second distribution path having a second, fixed duration, the duration of the clock pulses in the second path being less than the clock pulses in the first path.

U.S. Pat. No. 5,258,660 teaches a clock distribution system including a skew compensation means where delay adjusted clock signals of fixed duration are provided to logic circuits.

U.S. Pat. No. 4,862,096 teaches a clock distribution system including a number of time slice generators, each of which providing an output signal only when enabled by a state machine.

U.S. Pat. No. 5,208,776, which is perhaps the most extreme case of patent overkill in existence, (200 columns of specification and 191 sheets of drawing to support 8 claims) teaches a clock distribution system including a serial connected chain of delay elements, and circuits to prevent overlap of delayed pulses.

U.S. Pat. No. 5,389,831 teaches a clock generator for producing a pair of nonoverlapping clock signals.

U.S. Pat. No. 5,173,618 teaches a clock generator for producing a pair of nonoverlapping clock signals with adjustable skew. This patent seems to be a precursor to U.S. Pat. No. 5,389,831.

U.S. Pat. No. 5,216,301 teaches a circuit for generation of a chain of identical time delayed pulses.

U.S. Pat. No. 4,414,637 teaches a circuit for generation of a rectangular wave train using multiple delay lines.

Although the patents generally teach clock distribution systems, and the use of delay circuits for delaying a chain of pulses, none of the patents teaches the present invention taught and claimed herein.

Self reset CMOS (SRCMOS) circuits provide very fast evaluation in digital logic circuits. SRCMOS circuits can be evaluated with signals which have a very small pulse width. In a full self resetting SRCMOS circuit, each individual circuit in a latch-to-latch path must have overlapping input pulses and a trigger reset from a last pulse received at the circuit interface. (See FIG. 1) Since the operative signals to the SRCMOS circuits have a very small pulse width, there is a high risk of incorrect logic evaluation resulting in an error if the pulses are not properly controlled.

For example, in the prior art circuit shown in FIG. 1, circuit 1 and circuit 2 are feeding output signals D1 and D2 to circuit 3. Circuit 3 will face some uncertainty because of the uncertainty as to the time of arrival of pulses D1 and D2. Also, circuit 3 does not have control of the input pulse width which is very narrow. Further, since these small pulses can come from different sources, circuit 1 and circuit 2, time of arrival of the leading edge of pulses D1 and D2 at circuit 3 and the pulse width of pulses D1 and D2 become critical for a minimum overlap to insure a proper evaluation of circuit 3.

SUMMARY OF THE INVENTION

Therefore, it is an object of the present invention to efficiently clock a SRCMOS circuit using a differential clock pipeline to generate clock signals for each stage in a logic circuit appropriate for the timing conditions of signals input to such stage of the logic circuit.

Accordingly, a system for clocking self resetting CMOS (SRCMOS) circuits operating at high speed includes a clock generator circuit which produces a first pipeline clock pulse of relatively narrow width from a leading edge of a system clock having a relatively long duration with respect to the first pipeline clock, a number of delay circuits, the time duration of each of the delay circuits being determined by characteristics of evaluation logic in the SRCMOS circuits being clocked, the delay circuits being connected in a serial pipeline fashion such that each subsequent delayed clock pulse overlaps a preceding clock pulse by at least a predetermined minimum time duration. The clocking system also includes a cycle relax mode whereby the clock pulse output of the clock generator circuit may be extended for test or diagnostic purposes.

It is an advantage of the present invention that SRCMOS circuits may be clocked and evaluated relatively free of timing errors resulting from uncontrolled high speed narrow pulse duration clock signals as in the prior art.

Other features and advantages of the present invention will become apparent in the following detailed description of the preferred embodiment of the invention taken in conjunction with the accompanying drawing.

DETAILED DESCRIPTION OF A PREFERRED EMBODIMENT OF THE INVENTION

Figure 1:
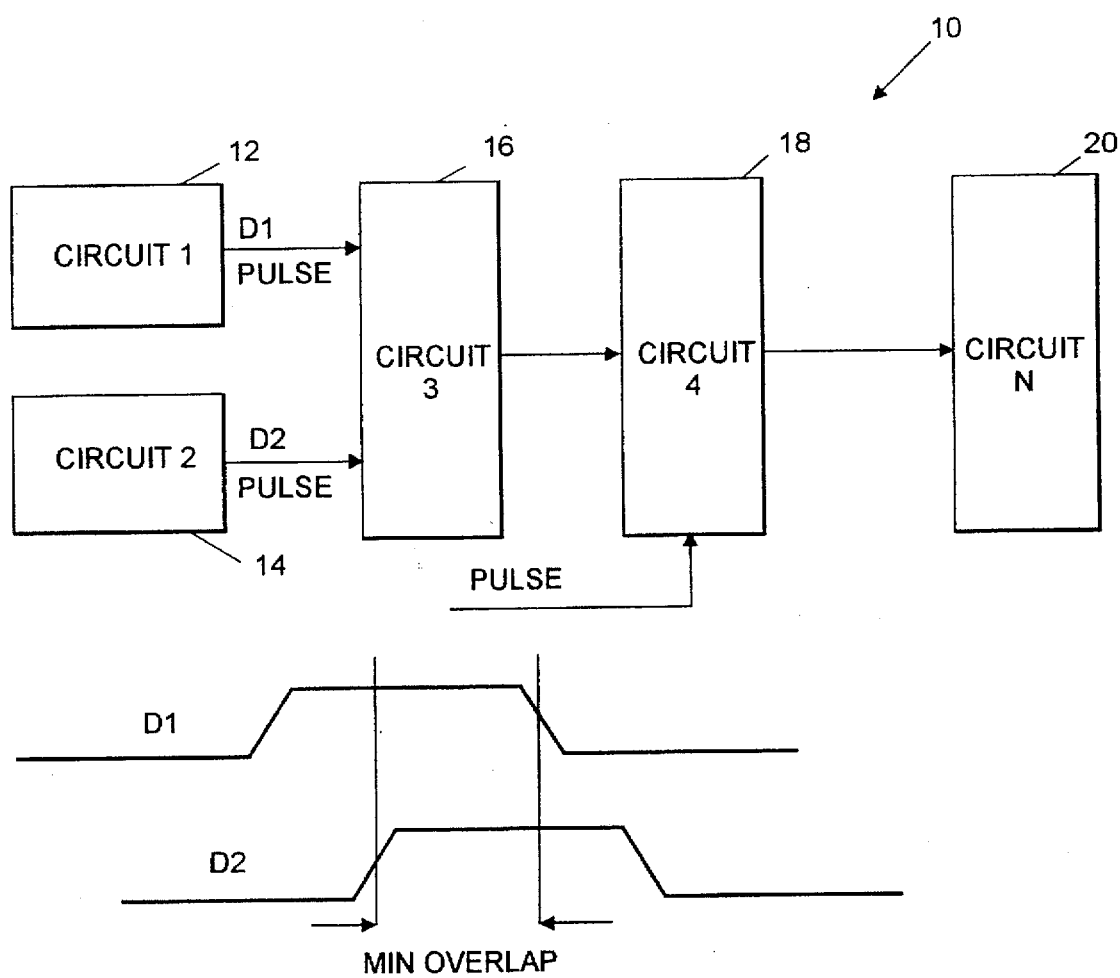
FIG. 1 is a block diagram of a PRIOR ART SRCMOS circuit including a timing diagram of pulses input to a circuit to be evaluated.

Referring now to FIG. 1, a prior art SRCMOS circuit and the timing thereof will be described.

A prior art SRCMOS circuit 10 may include circuit 1 12 which generates a first output pulse D1 (shown in the timing diagram of FIG. 1) and a circuit 2 14 which produces an output pulse D2 (also shown in the timing diagram of FIG. 1). It should be noted that for proper operation of subsequent circuits such as circuit 3 16, circuit 4 18 and circuit n 20, there must be a minimum overlap time between pulses D1 and D2. If the timing between the output pulse D1 of circuit 12 and the output pulse of D2 of circuit 14 is not precisely controlled, the minimum overlap shown in the timing diagram of FIG. 1 will be insufficient for proper evaluation of circuit 3 16 and an error condition may result. Further, failure to properly control the timing of pulses D1 and D2 may also result in excessive power consumption.

Figure 2:
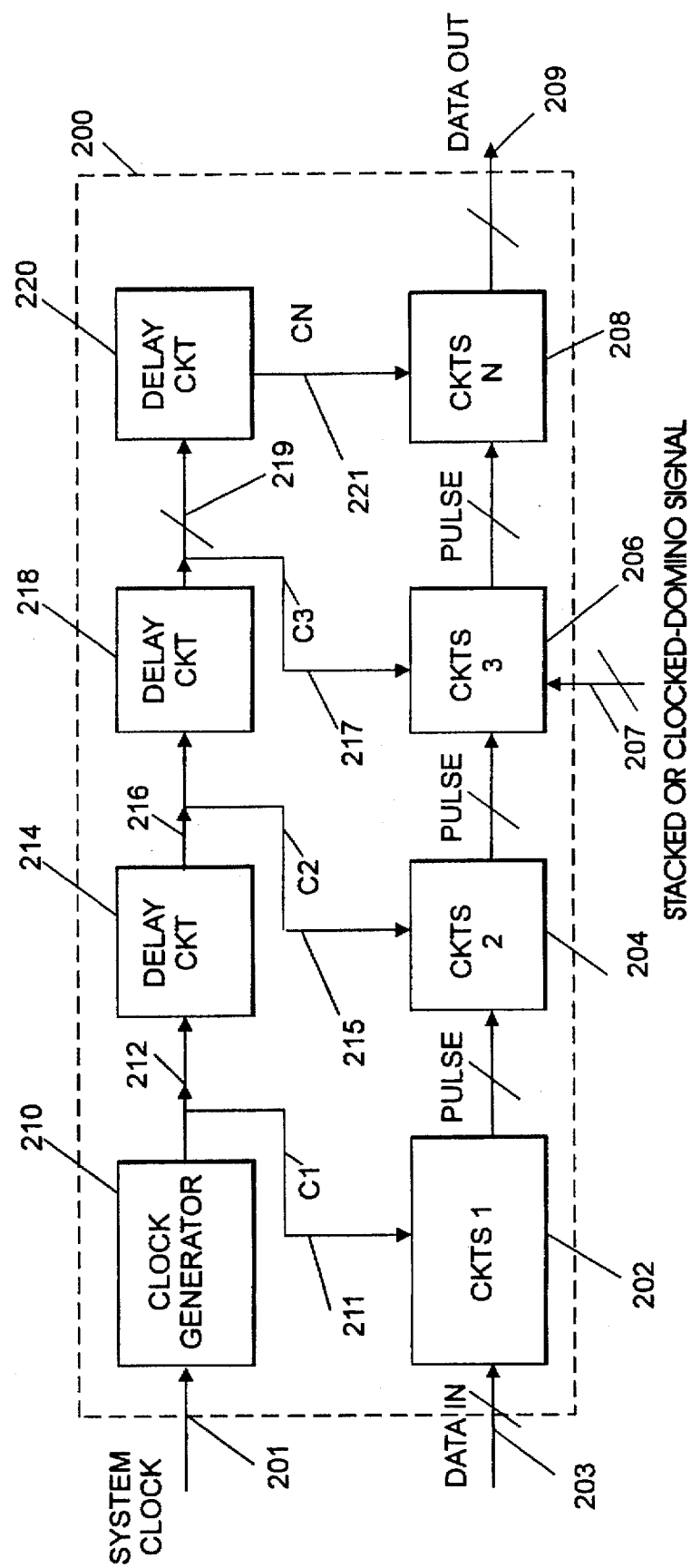
FIG. 2 is a block diagram of an SRCMOS circuit including a clock pulse distribution system according to the present invention.

Referring now to FIG. 2, a block diagram of a SRCMOS circuit including a clocking system in accordance with the present invention will be described.

The overall circuit 200 shown in FIG. 2 can be considered as a segregated unit on an integrated circuit chip with inputs of DATA IN 203 and System Clock 201 and an output of DATA OUT 209. There may also be static or clocked domino signals input to intermediate circuits in circuit 200.

The DATA IN on line 203 is connected to a first circuit 202 where the DATA IN is evaluated. The output of circuit 202 is connected to circuit 204 where further data evaluation takes place. The output of circuit 204 is connected to an input of circuit 206 which may also have as inputs a static or clocked domino signal on line 207. The evaluated output of circuit 206 is input to any number of subsequent circuits in the overall circuit 200 until a last circuit 208 is reached in the evaluation chain which produces a data output signal on line 209 which would be input to a further circuit in the overall logic system.

To insure that logic evaluations are properly performed in each of the circuits 202, 204, 206, and 208, respectively, the system clock on line 201 is used to generate a number of overlapped, delayed clock pulses of relatively short duration in comparison to the period of the system clock where the delayed short duration clock pulses are used to clock the evaluations of the various circuits 202, 204, 206, and 208, respectively. System clock 201 is input to clock generator 210. Differential clock generator 210 will be described in greater detail with reference to FIG. 3.

Clock generator 210 produces an output C1 (see the timing diagram of FIG. 4) which is a clock pulse of relatively short duration as compared to the period of the system clock 201 and which is delayed by some amount from the rise of system clock 201 due to internal circuit delays in clock generator 210. Clock signal C1 is connected to circuit 202 on line 211 and to a next circuit in the clock pipeline, delay circuit 214 on line 212. The time duration of delay in delay circuit 214 is determined either by computation of a time at which a delayed clock C2 should arrive at circuit 204 or by empirical data during some phase of circuit or system testing. Delay clock signal C2 is input to circuit 204 on line 215 and provides an input to a next delay circuit 218 in the clock pipeline on line 216. As with delay circuit 214, delay circuit 218 has a predetermined time duration of the delay such that clock signal C3 produces an input on line 217 to circuit 206 at a proper time for evaluation of circuit 206. Clock signal C3 also is connected on line 219 to delay circuit 220 which provides a clock input Cn on line 221 to circuit n 208, the last circuit in the overall circuit 200. The output of circuit 208 is DATA OUT on line 209.

Figure 4:
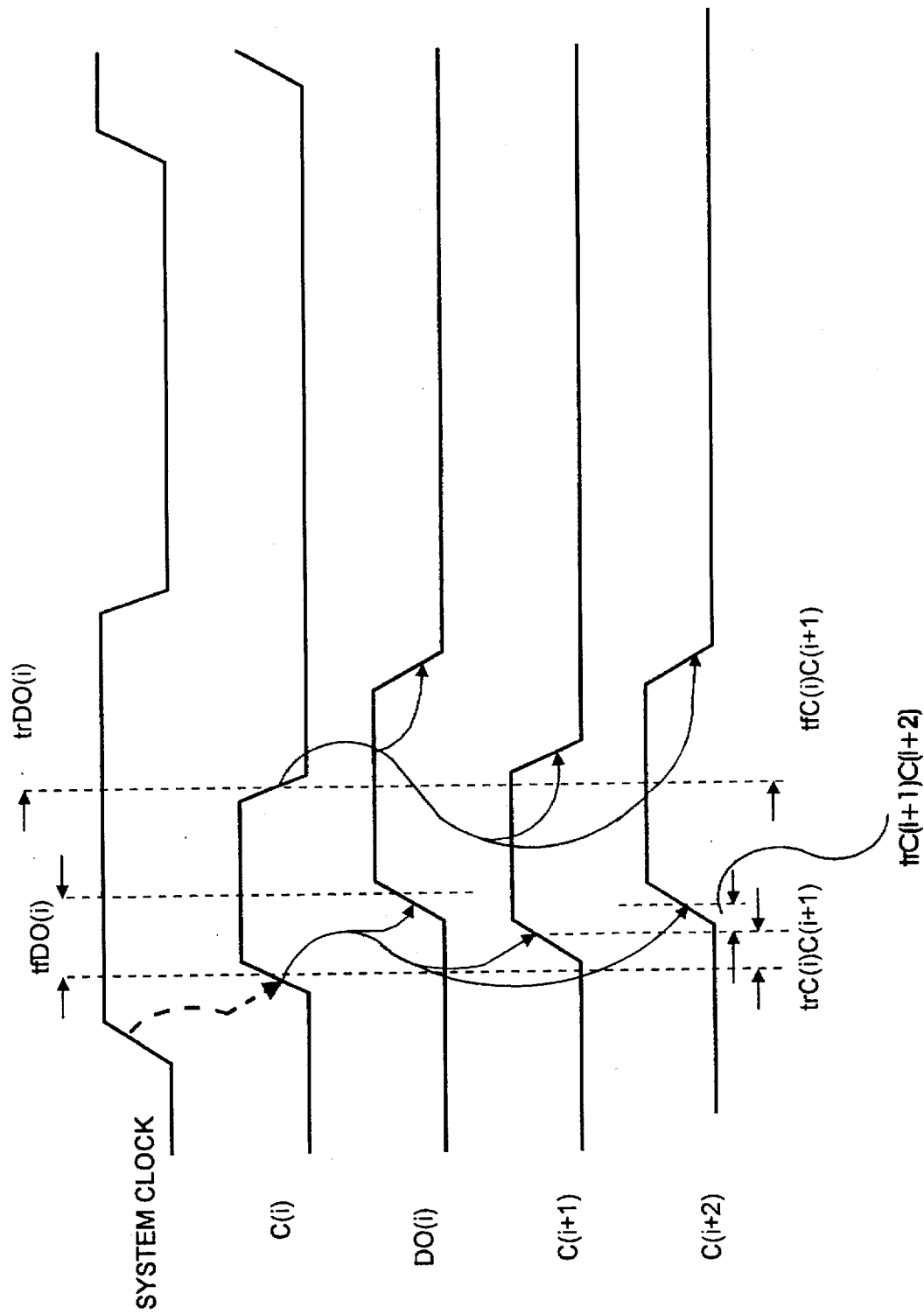
FIG. 4 is a timing diagram of the time relationship between 2 sequential clock signals in the clock pulse distribution system of FIG. 2.

As can be seen from the timing diagram of FIG. 4, each of the pipelined, relatively short duration clock pulses C1, C2, C3 . . . Cn are delayed from the preceding clock pulse in the pipeline and have a substantial overlap of the active time of the pulse with the preceding pulse in the pipeline.

Figure 3:
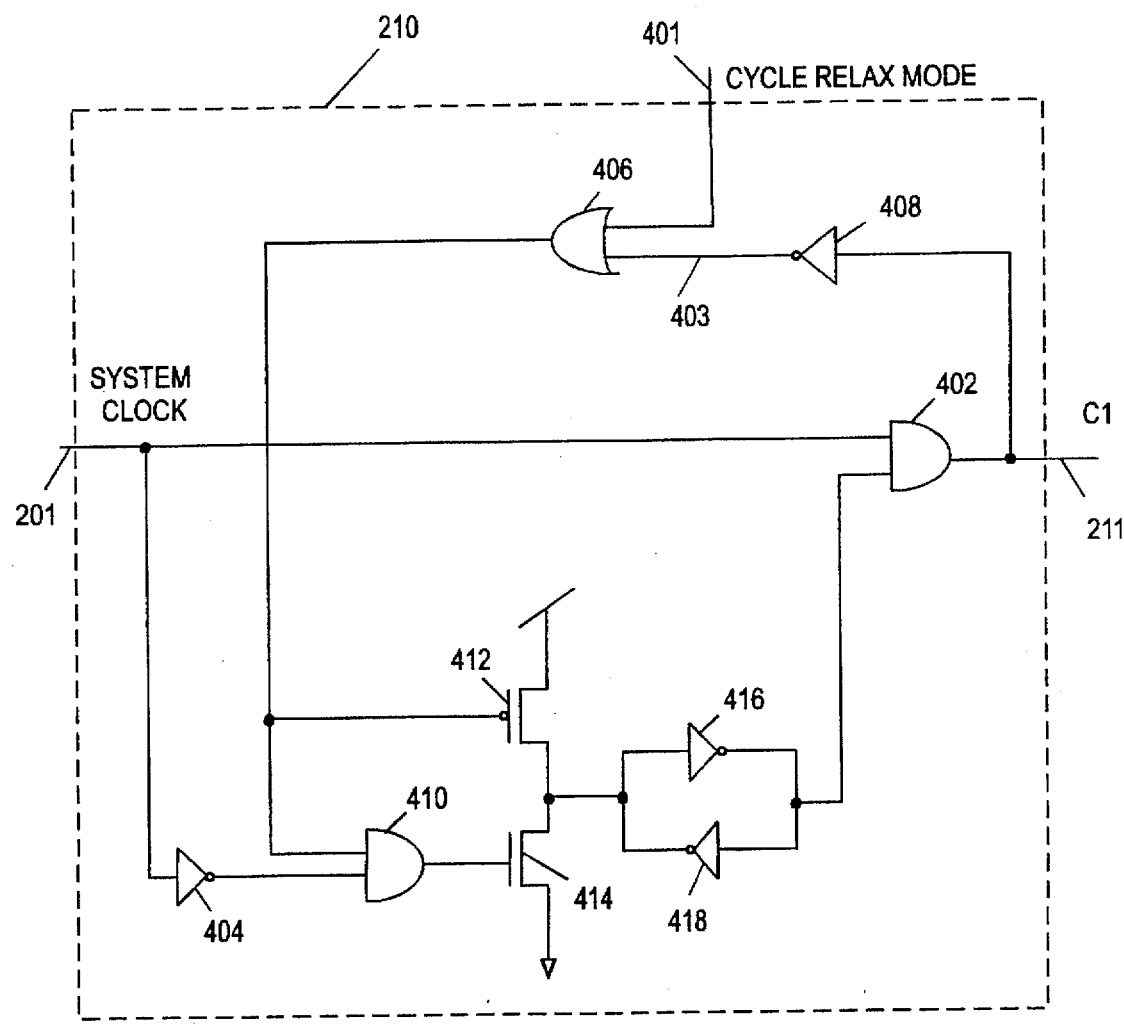
FIG. 3 is a circuit diagram of a differential clock pulse generator of FIG. 2.

Referring now to FIG. 3, clock generator circuit 210 and a cycle relax mode will be described.

As described above, the input to clock generator 210 is system clock 201 and the output is short duration clock pulse C1 on line 211. For the cycle relax mode, an additional input line controlling the cycle relax mode 401 is connected to clock generator circuit 210. During normal operation, the cycle relax mode signal on line 401 is inactive or set to 0. System clock 201 is connected to AND gate 402 and to inverter 404. Cycle relax mode signal 401 is connected to OR gate 406 in the self reset path of clock generator circuit 210. The second input to OR circuit 406 is the inverted output of AND circuit 402 on line 403. The output of AND circuit 402 is clock pulse C1. The output of AND 402 is connected to an input of inverter 408 which provides the inverted C1 pulse on line 403 to OR circuit 406. The output of OR circuit 406 is connected to AND 410 and to gate of transistor 412 which is part of the transistor pair 412, 414 which holds the state of the latch including transistors 416 and 418.

Differential clock signal C1 is generated from the rising edge of system clock signal. The duration of clock signal C1 is controlled by the self reset path which consists of inverter 408, cycle relax mode OR gate 406 and circuit 410, transistors 412 and 414 and inverters 416 and 418 which together form the circuit which controls the turn-off of a second input to AND circuit 402 and thus controls the duration of clock pulse C1.

If the cycle relax mode line 401 is high, cycle relax mode controls the width of clock pulse C1 and the self reset path of clock generator circuit 210 is overridden.

Referring now to FIG. 4, the timing relationship between the system clock, a pair of sequential differential clock pulses, and data output of an evaluation circuit will be described.

As described previously, clock C(i) follows the system clock, rising from 0 to 1 at some predetermined time after the rise of the system clock signal. Additional differential clock pulses C(i+1) and C(i+2) rise after predetermined time delays as described above. The time delay are set so that pulses C(i) and C(i+1) overlap and pulses C(i+1) and C(1+2) overlap. The data output DO(i) of the circuit under evaluation clock pulse C(i) becomes active at some point after the rise of clock pulse C(i). This data output DO(i) signal must remain active for a long enough duration such that it may be used for evaluation of the next evaluation circuit which is clocked by clock pulse C(i+1). The fall of DO(i) of the circuit under evaluation and the next clock pulse C(i+1) are controlled by the fall of clock pulse C(i). Thus, insuring that both the data output of the circuit under evaluation and the clock pulse for the next circuit to be evaluate remain active a sufficiently long duration to prevent errors resulting from race conditions.

Figure 5:
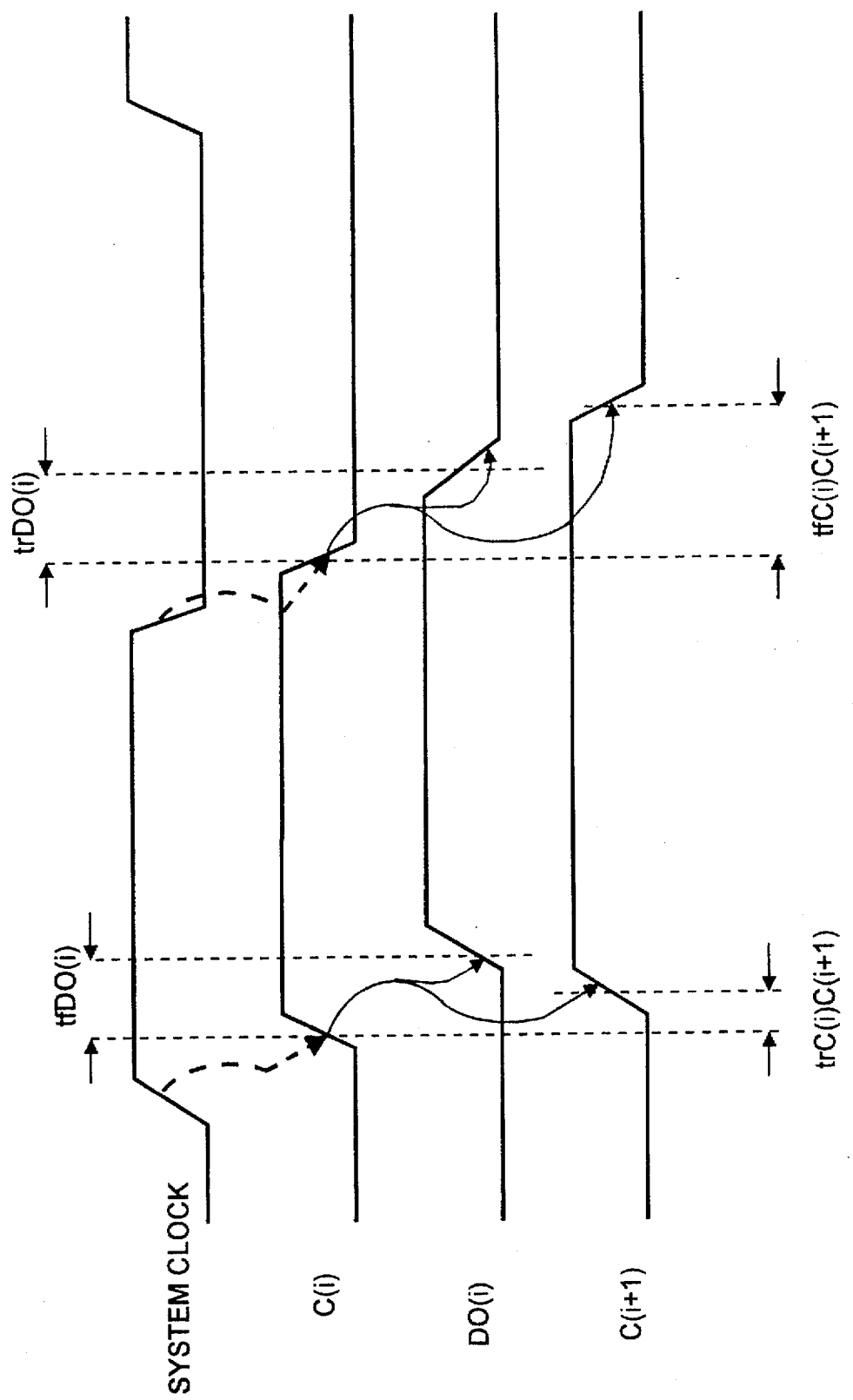
FIG. 5 is a timing diagram of the time relationship between 2 sequential clock signals in the clock pulse distribution system of FIG. 2 when operating in cycle relax mode.

Referring now to FIG. 5, timing relationships in cycle relax mode will be further described.

As above, a clock pulse C(i) rises at some time following the rise of the system clock. The data output of the circuit under evaluation DO(i) rises after the time for evaluation in circuit N (see FIG. 2). Differential pulse C(i+1) rises after a predetermined delay following the rise of differential clock pulse C(i). Since cycle relax mode is active, pulse C(i) will remain high until the fall of the system clock signal. Thus, in cycle relax mode, the duration of clock pulse C(i) is approximately equal to the duration of the system clock pulse. The output data from evaluation circuit N stays active for a period of time after the fall of clock pulse C(i). Also, subsequent differential clock pulse C(i+1) stays active until after the fall of the DO(i) output of the previous circuit under evaluation.

Cycle relax mode enables the operation of circuit 200 (see FIG. 2) to be operated with the relatively long duration pulses equal in length to the system clock pulse for test or error detection purposes.

It will be appreciated that although a specific embodiment of the present invention has been described herein for the purposes of illustration, various modifications may be made without departing from the spirit or scope of the invention.

Accordingly, the scope of this invention is limited only by the following claims and their equivalents.

What is claimed is:

1. A system for clocking logic circuits operating at high speed, comprising:

a clock generator circuit for generating a first clock pulse of relatively narrow width from a leading edge of a system clock having a relatively long duration with respect to the first clock pulse; and a plurality of delay circuits, the delay time of each of the delay circuits being determined by characteristics of evaluation logic in the logic circuits being clocked, the delay circuits being connected in series such that each subsequent delayed clock pulse overlaps a preceding clock pulse by at least a predetermined minimum time duration, each delay circuit producing a clock signal at a time in each system clock cycle appropriate for evaluation of a predetermined stage of the logic circuit.

2. A system for clocking logic circuits operating at high speed, according to claim 1, wherein the clock generator circuit further comprises:

a cycle relax control circuit which controls the duration of the clock pulse output of the clock generator circuit for test or diagnostic purposes.

3. A system for clocking logic circuits operating at high speed, according to claim 1, wherein the logic circuit comprises:

one or more self resetting CMOS logic circuits.

4. A system for clocking logic circuits operating at high speed, according to claim 1, wherein each of the delay circuits comprises:

one or more logic blocks, each having a predetermined input to output delay characteristic.

5. A system for clocking logic circuits operating at high speed, according to claim 1, wherein each of the logic blocks is an inverter circuit.

6. A logic unit for use in an information handling system, comprising:

a set of sequentially evaluated logic blocks, operable at a high clock speed;

a differential clock pipeline circuit for generating clock pulses of appropriate time duration and position for evaluation of the logic blocks; and wherein each logic block is a self resetting CMOS circuit.

7. A logic unit for use in an information handling system, comprising:

a set of sequentially evaluated logic blocks, operable at a high clock speed;

a differential clock pipline circuit for generating clock pulses of appropriate time duration and position for evaluation of the logic blocks; and wherein the differential clock pipeline circuit comprises:

a clock generator circuit for generating a first clock pulse of relatively narrow width from a leading edge of a system clock having a relatively long duration with respect to the first clock pulse; and a plurality of delay circuits, the delay time of each of the delay circuits being determined by characteristics of evaluation logic in the logic circuits being clocked, the delay circuits being connected in series such that each subsequent delayed clock pulse overlaps a preceding clock pulse by at least a predetermined minimum time duration, each delay circuit producing a clock signal at a time in each system clock cycle appropriate for evaluation of a predetermined stage of the logic circuit.

8. A logic unit for use in an information handling system, according to claim 7, wherein the differential clock pipeline circuit further comprises:

a cycle relax control circuit which controls the duration of the clock pulse output of the clock generator circuit for test or diagnostic purposes.

9. A method for clocking logic circuits operating at high speed, comprising the steps of:

generating a first clock pulse having a relatively short duration from a leading edge of a system clock pulse having a relatively long duration with respect to the first clock pulse; and delaying the first clock pulse in a plurality of delay circuits, the delay time of each of the delay circuits being determined by characteristics of evaluation logic in logic circuits being clocked, each delay circuit producing a clock signal at a time in each system clock cycle appropriate for evaluation of a predetermined stage of the logic circuit.

10. A method for clocking logic circuits operating at high speed, according to claim 9, wherein the delay circuits are connected in series such that each subsequent delayed clock pulse overlaps a preceding clock pulse by at least a predetermined minimum time duration.

11. A method for clocking logic circuits operating at high speed, according to claim 9, further comprising the step of:

controlling the duration of the clock pulse output of the clock generator circuit, in a cycle relaxation control circuit, for diagnostic purposes.

12. A method for clocking logic circuits operating at high speed, according to claim 9, wherein the delaying step further comprises the steps of:

generating a series of delayed pulses from the first clock pulse, wherein each of the delayed pulses is output from one of a plurality of delay circuits.

* * * * *